United States Patent [19]
Jin

[11] Patent Number: 6,038,336
[45] Date of Patent: Mar. 14, 2000

[54] PCB TESTING CIRCUIT FOR AN AUTOMATIC INSERTING APPARATUS AND A TESTING METHOD THEREFOR

[75] Inventor: Sang-Hoon Jin, Taegu, Rep. of Korea

[73] Assignee: Daewoo Electronics Co., Ltd., Seoul, Rep. of Korea

[21] Appl. No.: 08/985,207

[22] Filed: Dec. 4, 1997

[51] Int. Cl.$^7$ .............................. G06K 9/00; G06K 9/32; H04N 7/18

[52] U.S. Cl. .......................... 382/147; 348/126; 348/129; 348/130; 382/294

[58] Field of Search .................................... 382/149, 151, 382/287, 294, 145; 348/126, 129, 130

[56] References Cited

U.S. PATENT DOCUMENTS

| | | | |
|---|---|---|---|
| 4,549,206 | 10/1985 | Suzuki et al. | 358/106 |
| 5,272,762 | 12/1993 | Sezaki et al. | 382/8 |
| 5,495,535 | 2/1996 | Smilansky et al. | 382/145 |
| 5,506,793 | 4/1996 | Straayer et al. | 364/571.01 |

OTHER PUBLICATIONS

Ito et al. Recognition of Pattern Defects of Printed Circuit Board Using Topological Information. IEEE/CHMT '91 Symposium. Jul. 1991. pp. 202–206, Jul. 1991.

*Primary Examiner*—Leo H. Boudreau
*Assistant Examiner*—Shawn B Cage
*Attorney, Agent, or Firm*—Jacobson, Price, Holman & Stern, PLLC

[57] ABSTRACT

A PCB testing circuit for an automatic inserting apparatus and method thereof can minimize an inferior rate of the PCB. The circuit includes a scanner for converting an image signal of a reference PCB into image data, an image detecting section in an o-line state, a storing section for storing the image data, hole information data and component information data by being formed with an image data storage for storing the image data of the scanner and image data detecting section, a hole information data storage and a component information data storage, a monitor for displaying the image data of the reference and modified PCBs on a screen, and a controlling section which receives the image data of the reference PCB and modified PCB received via the scanner and image data detecting section to detect the hole information data of the reference PCB and modified PCB, compares detected hole information data to detect the hole information data of the modified PCB which does not correspond to the hole information data of the reference PCB, and stores the unpaired hole information data in the hole information data storing section. Thus, the time required in newly designing a pattern of the PCB is shortened when the design of the PCB is modified or added.

6 Claims, 4 Drawing Sheets

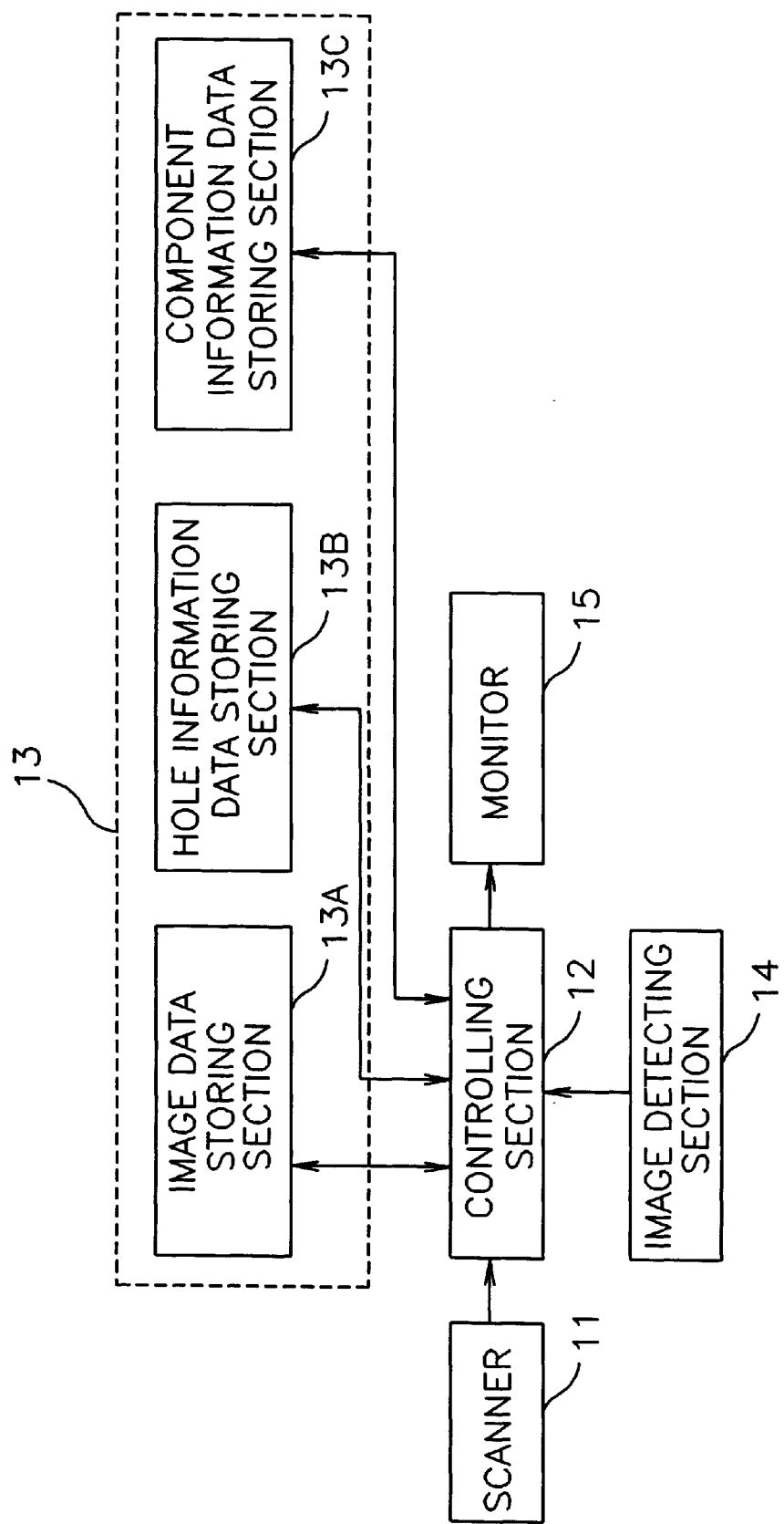

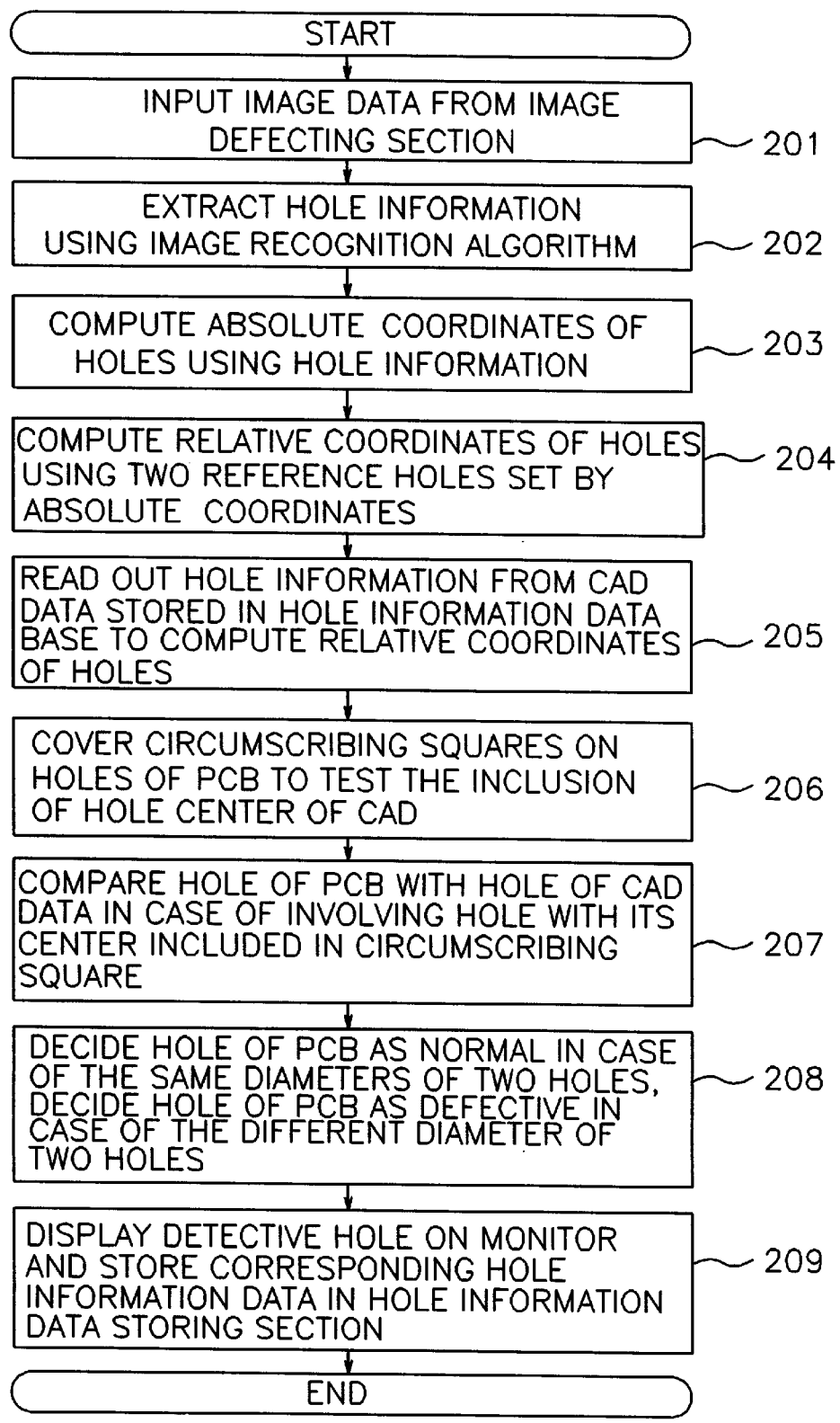

PCB TESTING CIRCUIT FOR AN AUTOMATIC INSERTING APPARATUS AND A TESTING METHOD THEREFOR

BACKGROUND OF THE INVENTION

1. Field of the Invention

The present invention relates to an automatic inserting apparatus, and more particularly to a circuit for testing a printed circuit board (hereinafter simply referred to as "PCB") capable of minimizing an inferior rate of the PCB by automatically checking the defect and modified state of the PCB, and a testing method for adopting the same.

2. Description of the Prior Art

As efforts have been directed at trying to automatically insert components into a PCB in general electronic appliances, the automatic insertion is being widely available now. The automatic inserting process will be described as follows.

An electric circuit diagram is drafted initially, and a PCB pattern is then prepared in accordance with the drafted electric circuit diagram. In view of the PCB pattern, a PCB is fabricated. Also, information data of components to be inserted into the PCB is produced.

By using the pattern of PCB, information with respect to mounting positions, mounted components and mounting directions of the components are extracted, and the extracted information is converted into numerical control data.

The numerical control data and component information data and components demanded for the PCB are supplied to an automatic inserting apparatus which in turn assembles the PCB. The components of the PCB which is automatically-inserted with the components are soldered by using an automatic brazing apparatus.

A defect test of the PCB produced as above is visually performed by a producer. In connection with the visual defect test in the PCB, the accuracy of the test differs in accordance with the fatigue and physical state of the tester. Therefore, the visual test becomes one detriment of incurring the defect of the PCB.

Also, in regard to the electronic appliances produced by means of the PCB, the goods are added with functions with the lapse of time and the number of components are decreased due to the economic basis. In these cases, the component information data with respect to the changed portions should be manually modified. Otherwise, the PCB is to be newly fabricated.

Besides, the detection of the numerical control data in terms of the circuit diagram and PCB pattern are currently designed by means of a computer aided design (hereinafter referred to as "CAD"). However, if the components are newly added to the PCB or there is no numerical control data with respect to the pattern of an existing PCB when the new components are to be inserted, positions of inserting the new components are should be manually measured one by one to produce the numerical control data.

SUMMARY OF THE INVENTION

Therefore, it is an object of the present invention to provide a testing a PCB for an automatic inserting apparatus capable of decreasing an inferior rate of the PCB by using hole information of the PCB and hole information recorded in a CAD, and a testing method therefor.

It is another object of the present invention to provide a PCB testing circuit for an automatic inserting apparatus capable of easily fabricating the PCB by using hole information of a reference PCB and a modified PCB when components of the PCB is changed, and a testing method thereof.

To achieve the above and other object of the present invention, there is provided a PCB testing circuit for an automatic inserting apparatus includes a scanner for converting an image signal of a reference PCB into image data during an off-line state, and an image detecting section for converting an image signal of a modified PCB into image data during an on-line state. A storing section stores the image data, hole information data and component information data by being formed with an image data storage for storing the image data of the scanner and image data detecting section, a hole information data storage for storing hole information of inserting components into the reference and modified PCBs, and a component information data storage for storing component information data to be inserted into the reference PCB. Also included as parts are a monitor for displaying the image data of the reference and modified PCBs on a screen, and a controlling section for receiving respective image data of the reference PCB and modified PCB received via the scanner and image data detecting section to detect the hole information data of respective reference PCB and modified PCB, comparing detected respective hole information data to detect the hole information data of the modified PCB which does not correspond to the hole information data of the reference PCB, and storing the unpaired hole information data in the hole information data storing section.

More specifically, the image data of the reference PCB supplied via the scanner and the image data of the modified PCB provided from the image detecting section are supplied to the controlling section. Then, the controlling section extracts the hole information data from respective PCBs by using the image recognition algorithm, compares the extracted hole information data to extract hole information data without a counterpart. The unpaired hole information data is supplied to the monitor and hole information data storing section. Thus, the monitor displays the unpaired hole information data in the PCB, and the hole information data storing section stores the unpaired hole information data therein. Consequently, since the PCB can be fabricated in accordance with the unpaired hole information data, the PCB is easily fabricated when the components are changed or modified.

BRIEF DESCRIPTION OF THE DRAWINGS

The above objects and other advantages of the present invention will become more apparent by describing in detail preferred embodiments thereof with reference to the attached drawings in which:

FIG. 3 is a view showing a construction of the PCB testing circuit for the automatic inserting apparatus according to a second embodiment of the present invention; and FIG. 4 is a view showing the method for testing the PCB of the automatic inserting apparatus according to a second embodiment of the present invention.

DETAILED DESCRIPTION OF THE PREFERRED EMBODIMENTS

Figure 1:
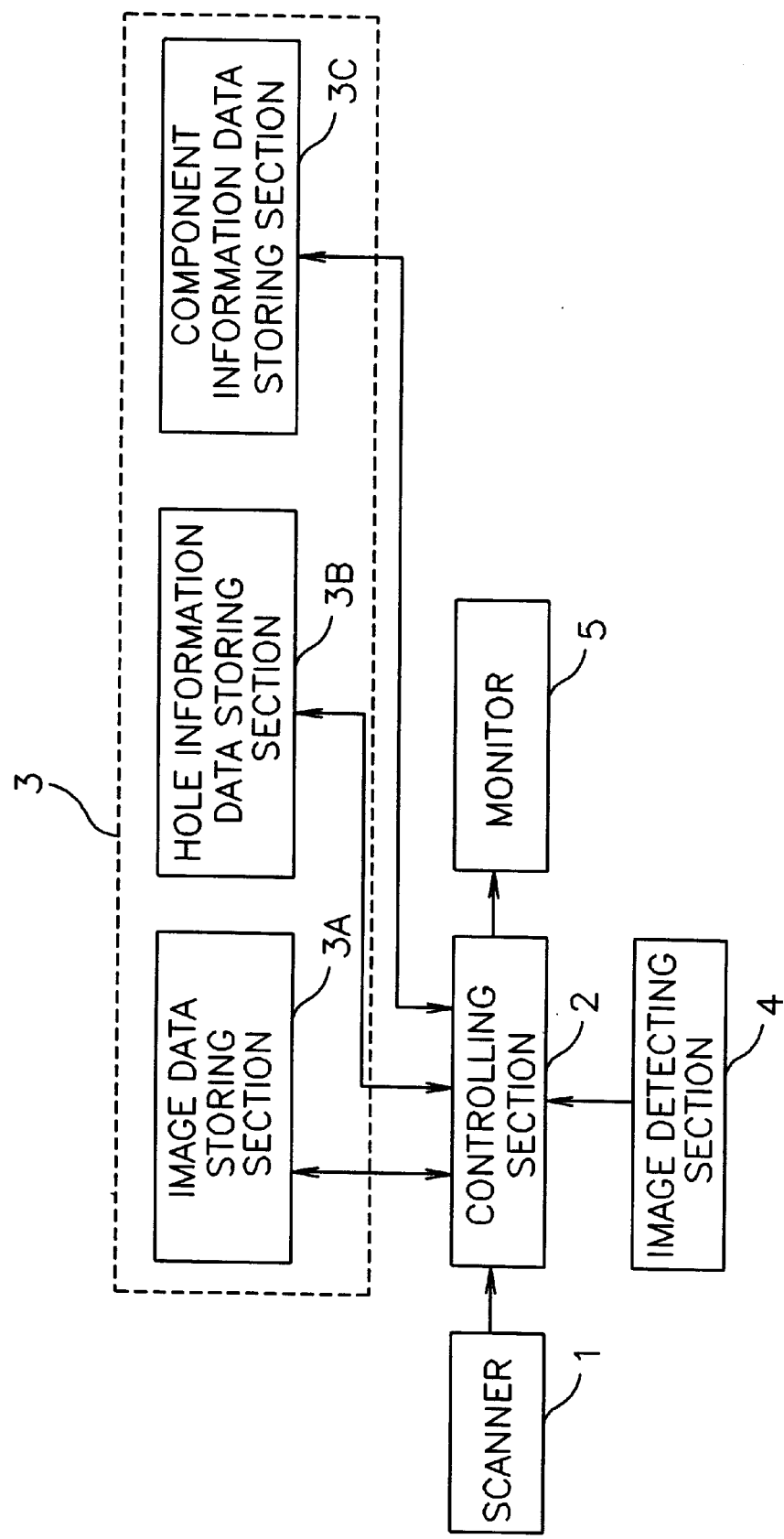
FIG. 1 is a view showing a construction of a PCB testing circuit for an automatic inserting apparatus according to a first embodiment of the present invention.

FIG. 1 is a view showing a construction of a PCB testing circuit for an automatic inserting apparatus according to a first embodiment of the present invention. In FIG. 1, a reference numeral 1 denotes a scanner for reading out an image signal of a reference PCB to convert it into image data; and 4, an image detecting section for reading out an image signal of a modified PCB to convert it into image data. A reference numeral 2 denotes a controlling section for receiving the image data of scanner 1 and image detecting section 2 to extract respective hole information data by using an image recognition algorithm, and compares the extracted hole information to provide hole information data without having a counterpart.

A reference numeral 3 denotes a storing section which includes an image data storage 3A, a hole information data storage 3B and a component information data storage 3C for respectively storing the image data, hole information data and component information data provided from controlling section 2. Also, a reference numeral 5 denotes a monitor for receiving a control signal from controlling section 2 to display the image data.

Figure 2:
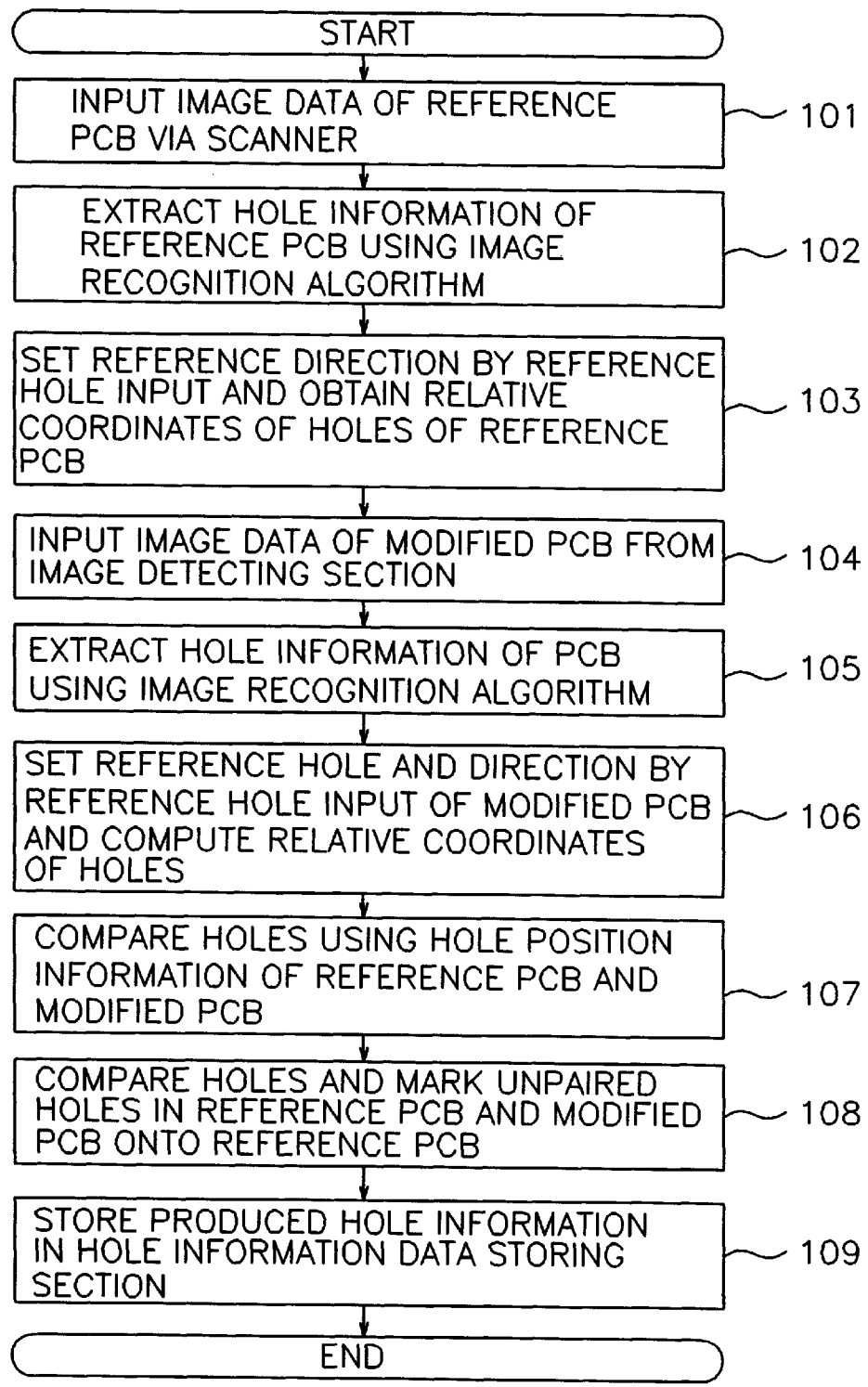
FIG. 2 is a view showing a method for testing the PCB of the automatic inserting apparatus according to the first embodiment of the present invention.

FIG. 2 is a view showing a method for testing the PCB of the automatic inserting apparatus according to the first embodiment of the present invention. Referring to FIG. 2, the method for testing the PCB of the automatic inserting apparatus will be described.

The image data of the reference PCB supplied via scanner 1 is read out (step 101), and the hole information of the reference PCB is extracted from the read-out image data by means of the image recognition algorithm. Then, the extracted hole information data is stored in hole information data storage 3B (step 102).

After performing step 102, reference coordinates are set by using the hole information data of the reference PCB, and the set reference coordinates are utilized to obtain relative coordinates of the reference PCB (step 103).

Meantime, the image data of the modified PCB supplied via image detecting section 4 is read out (step 104), and the hole information of the read-out image data is extracted by using the image recognition algorithm (step 105).

After executing step 105, the hole information data of the modified PCB is utilized for setting reference coordinates, and the set reference coordinates are employed to obtain relative coordinates of the holes of the modified PCB (step 106).

Successively, the hole position information of the reference PCB and modified PCB respectively obtained in steps 103 and 106 is used for comparing the hole information data (step 107). Then, the hole information data unpaired in step 107 is marked onto the reference PCB (step 108).

The unpaired hole information data marked onto the reference PCB is stored in hole information data storage 3B (step 109).

The operation and effect of the PCB testing circuit formed as above and corresponding method according to the first embodiment of the present invention will be described.

The image data of the reference PCB and that of the modified PCB respectively detected from scanner 1 and image detecting section 4 are supplied to controlling section 2. In turn, controlling section 2 supplies the image data of the reference PCB and modified PCB into image data storage 3A, extracts the hole information data of respective image data, and extracts the hole position information of the extracted hole information data. Also, by means of the extracted hole position information, the hole of the reference PCB is compared with that of the modified PCB and the hole information data without having the counterpart is marked onto the reference PCB.

The unpaired hole information data is stored in hole information data storage 3C. The hole information data is supplied to monitor 5 which displays the hole information data.

In other words, the image data of the reference PCB received via scanner 1 is read out (step 101), and the image recognition algorithm is used to extract the hole information of the reference PCB. Thereafter, the extracted hole information data is stored in hole information data storage 3B (step 102).

After executing step 102, step 103 is carried out. That is, in step 103, the hole information data of the reference PCB is utilized to set the reference coordinates, and the relative coordinates of the holes of the reference PCB are obtained by using the set reference coordinates.

On the other hand, the image data of the modified PCB supplied via image detecting section 4 is read out (step 104), and the hole information of the read-out image data is extracted by means of the image recognition algorithm (step 105).

Also, after performing step 105, the hole information data of the reference PCB is utilized to set the reference coordinates, and the set reference coordinates are utilized to obtain the relative coordinates of the holes in the reference PCB (step 106).

By using the hole position information of the reference PCB and modified PCB respectively obtained in steps 103 and 106, the hole information data is compared (step 107). The hole information data unpaired in step 107 is displayed onto the reference PCB (step 108).

The unpaired hole information data displayed on the reference PCB in step 108 is stored in hole information data storage 3B (step 109).

When applying the PCB testing apparatus and method according to the first embodiment of the present invention, the hole information data in the reference PCB obtained by the modified or added design can be automatically detected in accordance with the presence of the hole information data detected from the reference PCB and hole information data detected from the modified PCB. For this reason, the time required for newly producing the pattern of the PCB can be reduced when the design of the PCB is modified or added.

FIG. 3 is a view showing a construction of the circuit for testing the PCB of the automatic inserting apparatus according to a second embodiment of the present invention. In FIG. 3, a reference numeral 11 denotes a scanner for reading out an image signal of a reference PCB to convert it into image data during a line-off state; and 14, an image detecting section for reading out the image signal of the PCB to convert it into the image data in case of a line-on state. A reference numeral 12 denotes a controlling section for receiving image data via scanner 1 or from image detecting section 14 to extract respective hole information data by using an image recognition algorithm, and compares the extracted hole information with hole information data supplied via a CAD to provide hole information data having different hole sizes.

A reference numeral 13 denotes a storing section which includes an image data storage 13A, a hole information data storage 13B and a component information data storage 13C for respectively storing the image data, hole information data and component information data provided from controlling section 12. Also, a reference numeral 15 denotes a monitor for receiving a control signal from controlling section 12 to display the image data.

FIG. 4 is a view showing the method for testing the PCB of the automatic inserting apparatus according to a second embodiment of the present invention. Referring to FIG. 4, the method for testing the PCB of the automatic inserting apparatus will be described.

The image data of the reference PCB received via scanner 11 during the off-line state or provided from image detecting section 14 during the on-line state is read out (step 201), and the hole information of the PCB is extracted from the read-out image data by means of the image recognition algorithm. Then, the extracted hole information data is stored in hole information data storage 13B (step 202).

By using the hole information data extracted from step 202, absolute coordinates are computed (step 203), and two reference holes are set from the absolute coordinates computed in step 204, and relative coordinates of respective holes are extracted by centering about the set reference holes (step 204).

Meantime, the hole information data stored in hole information data storage 13B is read out, and the relative coordinates of respective holes of the read-out hole information data are computed (step 205). Also, in order to test whether the hole of the PCB is included in the center of the hole computed in step 205 or not, circumscribing squares are covered over respective holes of the PCB extracted in step 204 (step 206).

When the hole of the PCB exists within the covered circumscribing square, the hole size of the PCB is compared with the hole size supplied from the CAD (step 207). In step 207, if the hole sizes are identical to each other, it is decided as a normal hole, and if not, it is decided as an abnormal hole (step 208).

The hole information data corresponding to the abnormal hole decided in step 208 is displayed on monitor 15, and the defective hole information data is stored in hole information data storage 13B (step 209).

The operation and effect of the PCB testing circuit formed as above and method according to the second embodiment of the present invention will be described.

The image data of the PCB provide via scanner 11 during the off-line state or image detecting section 14 during the on-line state is supplied to controlling section 12. In turn, controlling section 12 extracts the hole information data of the PCB from the image data of scanner 11, and receives the extracted hole information data and hole information data of the CAD stored in hole information data storage 13B to compare the size of two holes, thereby detecting a defective hole in accordance with the result of the comparison.

The hole information data detected as being defective is stored in hole information data storage 13C. Then, the hole information data is supplied to monitor 15 which displays the defective hole information data.

In other words, the image data of the reference PCB received via scanner 11 during the off-line state or provided from image detecting section 14 during the on-line state is read out (step 201). Thereafter, the hole information of the reference PCB is extracted by using the image recognition algorithm from the read-out image data, and the extracted hole information data is stored in hole information data storage 13B (step 202).

The absolute coordinates are computed by using the hole information data extracted in step 202 (step 203). Then, two reference holes are set from the absolute coordinates computed in step 203, and the relative coordinates of respective holes are extracted by centering about the set reference holes (step 204).

On the other hand, the hole information data stored in hole information data storage 13B is read out, and the relative coordinates of respective holes of the read-out hole information data are computed (step 205). Then, in order to test whether the hole of the PCB is included into the center of the hole computed in step 205 or not, the circumscribing squares are covered over respective holes of the PCB extracted in step 204 (step 206).

If the hole of the PCB exists within the covered circumscribing square, the hole size of the PCB is compared with the hole size supplied from the CAD (step 207). When the hole sizes are identical to each other in step 207, it is decided as the normal hole, and if not, it is decided as the abnormal hole (step 208).

The hole information data corresponding to the abnormal hole decided in step 208 is displayed on monitor 15, and the inferior hole information data is stored in hole information data storage 13B (step 209).

When applying the PCB testing apparatus and method according to the second embodiment of the present invention, the presence of the hole information data and hole size supplied from the CAD are compared with the presence of the hole information data computed from the PCB and hole size to automatically detect the defect of the PCB, so that the testing time of the PCB is shortened to heighten the productivity.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A printed circuit board testing circuit for an automatic inserting apparatus comprising:

a scanner for converting an image signal of a reference printed circuit board into first image data;

image detecting means for converting an image signal of a modified printed circuit board into second image data;

storing means for storing said first and second image data, hole information data and component information data by being formed with image data storing means for storing said first and second image data of said scanner and image data detecting means, hole information data storing means for storing hole information of inserting components into said reference and modified printed circuit boards, and component information data storing means for storing component information data to be inserted into said reference printed circuit board;

a monitor for displaying said first and second image data of said reference and modified printed circuit boards on a screen;

a first controlling means for receiving respective first and second image data of said reference printed circuit board and modified printed circuit board received via said scanner and image data detecting means to detect said hole information data of respective reference printed circuit board and modified printed circuit board, comparing detected respective hole information data to detect the hole information data of said modified printed circuit board which does not correspond to said hole information data of said reference printed circuit board, and storing the unpaired hole information data in said hole information data storing means; and a second controlling means for comparing said hole information data stored in said reference printed circuit board received via said scanner with said hole information data of said CAD stored in said hole information data storing means, and detecting the defect of said reference printed circuit board, wherein said second controlling means performs steps of comparing said hole information data of said reference printed circuit board supplied via said scanner with said hole information data of said CAD to detect the defect of said reference printed circuit board, and the steps comprises:

a seventh step of reading out said first image data of said reference printed circuit board received via said scanner during an off-line state, and extracting said hole information data of said reference printed circuit board from said read-out first image data by using said image recognition algorithm;

an eighth step of computing absolute coordinates by using said hole information data extracted in said seventh step, setting two reference holes from said computed absolute coordinates, and extracting relative coordinates of respective holes by centering about the set reference holes;

a ninth step of reading out said hole information data of said CAD stored in said hole information data storing means, and computing said relative coordinates of respective holes of said read-out hole information data;

a tenth step of covering circumscribing squares over respective holes of said reference printed circuit board so as to check whether said hole of said reference printed circuit board computed in said eighth step is included in the center of said hole computed in said ninth step, and comparing a hole size of said printed circuit board with a hole size supplied from said CAD when the hole of said printed circuit board exists within said covered circumscribing square; and an eleventh step of deciding as a normal hole when said hole sizes are identical to each other or an abnormal hole when said hole sizes are different from each other in said tenth step, and storing said hole information data corresponding to said abnormal hole in said hole information data storing means.

2. A printed circuit board testing circuit for an automatic inserting apparatus as claimed in claim 1, wherein said first controlling means performs steps of detecting said hole information data having a modified design from said hole information data of said reference printed circuit board and that of said modified printed circuit board, and said steps comprises:

a first step of reading out said first image data of said reference printed circuit board, and extracting said hole information data of said reference printed circuit board from said read-out first image data by using an image recognition algorithm;

a second step of setting reference coordinates by using said hole information data of said reference printed circuit board, and obtaining relative coordinates of said holes of said reference printed circuit board by using set reference coordinates;

a third step of reading out said second image data of said modified printed circuit board, and extracting said hole information data of said modified printed circuit board from said read-out second image data by using said image recognition algorithm;

a fourth step of setting reference coordinates by using said hole information data extracted in said third step, and obtaining relative coordinates of the holes of said modified printed circuit board by using the set reference coordinates;

a fifth step of detecting unpaired hole information data by using said hole information data of said reference printed circuit board and modified printed circuit board extracted in said second and fourth steps; and a sixth step of storing said unpaired hole information data detected in said fifth step in said hole information data storing means.

3. A printed circuit board testing circuit for an automatic inserting apparatus as claimed in claim 1, further comprising a second controlling means for comparing said hole information data stored in said reference printed circuit board received via said scanner with said hole information data of said CAD stored in said hole information data storing means, and detecting the defect of said reference printed circuit board.

4. A method for testing a printed circuit board of an automatic inserting apparatus comprising:

a first step of reading out first image data of a reference printed circuit board received via a scanner, and extracting hole information data of said reference printed circuit board from said read-out first image data by using an image recognition algorithm;

a second step of setting reference coordinates by using hole information data of said reference printed circuit board, and obtaining relative coordinates of holes of said reference printed circuit board by using said set reference coordinates;

a third step of reading out second image data of a modified printed circuit board supplied from image detecting means, and extracting hole information data of said read-out second image data by using said image recognition algorithm;

a fourth step of setting reference coordinates by using said hole information data extracted from said third step, and obtaining said relative coordinates of said holes of said modified printed circuit board by using said set reference coordinates;

a fifth step of detecting unpaired hole information data by using said hole information data of said reference printed circuit board and modified printed circuit board extracted in said second step and fourth step;

a sixth step of storing said unpaired hole information detected in said fifth step in said hole information data storing means;

a ninth step of reading out said hole information data of said CAD after performing said second step, and computing said relative coordinates of respective holes of said read-out hole information data;

a tenth step of covering circumscribing squares over respective holes of said reference printed circuit board so as to check whether said hole of said reference printed circuit board computed in said second step is included in the center of said hole computed in said ninth step, and comparing a hole size of said printed circuit board with a hole size supplied from said CAD when the hole of said printed circuit board exists within said covered circumscribing square; and an eleventh step of deciding as a normal hole when said hole sizes are identical to each other or an abnormal hole when said hole sizes are different from each other in said tenth step, and storing said hole information data corresponding to said abnormal hole in said hole information data storing means.

5. A method for testing a printed circuit board of an automatic inserting apparatus comprising:

a seventh step of reading out first image data of a reference printed circuit board received via a scanner during an off-line state, and extracting hole information data of said reference printed circuit board by using an image recognition algorithm from said read-out first image data;

an eighth step of computing absolute coordinates by using said hole information data extracted in said seventh step, setting two reference holes from said computed absolute coordinates, and extracting relative coordinates of respective holes by centering about the set reference holes;

a ninth step of reading out said hole information data of said CAD stored in said hole information data storing means, and computing said relative coordinates of respective holes of said read-out hole information data;

a tenth step of covering circumscribing squares over respective holes of said reference printed circuit board so as to check whether said hole of said reference printed circuit board computed in said eighth step is included in the center of said hole computed in said ninth step, and comparing a hole size of said printed circuit board with a hole size supplied from said CAD when the hole of said printed circuit board exists within said covered circumscribing square; and an eleventh step of deciding as a normal hole when said hole sizes are identical to each other or an abnormal hole when said hole sizes are different from each other in said tenth step, and storing said hole information data corresponding to said abnormal hole in said hole information data storing means.

6. A method for testing a printed circuit board of an automatic inserting apparatus as claimed in claim 5, wherein said seventh step is performed by reading out said first image data of said reference printed circuit board provided from said image detecting means during said on-line state, and extracting said hole information data of said reference printed circuit board by using said image recognition algorithm from said read-out first image data.

* * * * *